(12) United States Patent
Schaepkens

(10) Patent No.: US 6,743,524 B2
(45) Date of Patent: Jun. 1, 2004

(54) BARRIER LAYER FOR AN ARTICLE AND METHOD OF MAKING SAID BARRIER LAYER BY EXPANDING THERMAL PLASMA

(75) Inventor: Marc Schaepkens, Ballston Lake, NY (US)

(73) Assignee: General Electric Company, Niskayuna, NY (US)

( * ) Notice: Subject to any disclaimer, the term of this patent is extended or adjusted under 35 U.S.C. 154(b) by 0 days.

(21) Appl. No.: 10/063,917

(22) Filed: May 23, 2002

(65) Prior Publication Data

US 2003/0219632 A1 Nov. 27, 2003

(51) Int. Cl.$^7$ .............................. B32B 27/00; B32B 7/00
(52) U.S. Cl. ..................... 428/689; 428/336; 428/337; 428/697; 428/698; 428/701; 428/702; 428/704; 428/913; 428/473.5; 428/412; 428/500; 313/504; 313/505; 136/244; 359/265
(58) Field of Search .............................. 428/336, 337, 428/689, 697, 701–702, 704, 913, 473.5, 412, 500, 698, 432, 441, 451, 469; 313/504, 505; 359/265, 56; 136/244

(56) References Cited

U.S. PATENT DOCUMENTS

| 4,871,580 | A | | 10/1989 | Schram et al. | |
|---|---|---|---|---|---|
| 6,015,951 | A | * | 1/2000 | Ikai et al. | 136/257 |
| 6,110,544 | A | | 8/2000 | Yang et al. | |
| 6,198,217 | B1 | * | 3/2001 | Suzuki et al. | 313/504 |
| 6,212,057 | B1 | * | 4/2001 | Kohara et al. | 361/301.4 |
| 6,355,125 | B1 | * | 3/2002 | Tahon et al. | 156/99 |

FOREIGN PATENT DOCUMENTS

| EP | 0460966 | 12/1991 |
|---|---|---|
| FR | 2712310 | 5/1995 |
| WO | WO 01/81649 | 11/2001 |

OTHER PUBLICATIONS

Osamu Fukumasa, "Synthesis of New Ceramics From Powder Mixtures Using Thermal Plasma Processing", Elsevier, Thin Solid Films, 390, pp. 37–43, 2001.

Application Ser. No. 09/681,820, filed Jun. 11, 2001, "Application and Method for Large Area Chemical Vapor Deposition Using Multiple Expanding Thermal Plasma Generators".

Application Ser. No. 09/836,657, filed Apr. 17, 2001, A Transparent Flexible Barrier for Liquid Crystal Display Devices and Method of Making the Same.

Application Ser. No. 09/683,148, filed Nov. 27, 2001, "Apparatus and Methods for Depositing Large Area Coatings on Non–Planar Surfaces".

Application Ser. No. 09,683,149, filed Nov. 27, 2001, "Apparatus and Method for Depositing Large Area Coatings on Planar Surfaces".

Philips Research Password, "Flexible Displays Cast Off Rigid Constraints", Dr. Peter Slikkerveer, Issue 10, Issue 10, pp. 5–7, Jan. 2002.

(List continued on next page.)

Primary Examiner—Deborah Jones
Assistant Examiner—Ling Xu
(74) Attorney, Agent, or Firm—Robert P. Santandrea; Patrick K. Patnode

(57) ABSTRACT

An article comprising a substrate having a barrier layer. The barrier layer is disposed on the surface of the substrate and resistant to transmission of moisture and oxygen. Methods of depositing such a barrier layer on the substrate are also disclosed. The article may include additional layers, such as, but not limited to, an adhesion layer, abrasion resistant layers, radiation-absorbing layers, radiation-reflective layers, and conductive layers. Such articles include, but are not limited to, light emitting diodes (LEDs), liquid crystal displays (LCDs), photovoltaic articles, electrochromic articles, and organic electroluminescent devices (OELDs).

55 Claims, 5 Drawing Sheets

OTHER PUBLICATIONS

Appl. Phys. Letter, *Etch Mechanism in the Refractive Index Silicon Nitride Plasma–Enchanced Chemical Vapor Deposition Process*, Yeo Kuo, vol. 63, No. 2, pp 144–146, Jul. 12, 1993.

American Vacuum Society, *"Transparent Barrier Coatings on Polyethylene Terephthalate By Single–and Dual–Frequency Plasma–Enhanced Chemical Vapor Deposition"*, A. S. da Silva Sorbrinho et al, A, vol. 16, No. 6, pp 3190–3198, Nov./Dec. 1998.

* cited by examiner

BARRIER LAYER FOR AN ARTICLE AND METHOD OF MAKING SAID BARRIER LAYER BY EXPANDING THERMAL PLASMA

BACKGROUND OF THE INVENTION

The invention relates to a barrier layer that is resistant to the transmission of moisture and oxygen. More particularly, the present invention relates to an article having such a barrier layer and methods of applying such a barrier layer to an article.

Different types of electronic devices such as, but not limited to, light emitting diodes (also referred hereinafter as "LEDs"), liquid crystal displays (also referred hereinafter as "LCDs"), photovoltaic articles, flat panel display devices, electrochromic articles, and organic electroluminescent devices (also referred hereinafter as "OELDs") share a common architecture: each device includes at least one substrate and at least one "active" layer.

Many of the materials that are used in the active layers of such devices are sensitive to environmental factors. Electrode materials in LEDs and OELDs are sensitive to air and moisture, as are the polymeric and organic compounds that are used in OELDs and the liquid crystal materials in LCDs. Exposure to the elements—particularly oxygen and water—may severely limit the lifetime of such devices.

Selection of a substantially impermeable substrate, such as glass, provides protection from environmental attack. Polymeric substrates that are used in flexible versions of such devices, however, do not provide adequate protection against oxygen and moisture. Consequently, at least one coating that is substantially impermeable to oxygen and water vapor must be applied to the polymeric substrate to achieve the desired level of protection.

Barrier materials have been applied to substrates using a variety of coating processes. Plasma enhanced chemical vapor deposition (PECVD), for example, has been used to deposit barrier materials. Typical PECVD processes, however, are relatively slow; i.e. the barrier material is deposited on the substrate at a rate of about 30 to 60 nm/min or less. In order to be commercially viable, the barrier coating must be applied to the substrate at a significantly higher deposition rate.

While barrier materials are needed to extend lifetimes of flexible display devices such as LCDs, LEDs, and OELDs to acceptable levels, the methods that are currently used to apply the needed barrier materials to substrates are too slow. Therefore, what is needed is a method of forming a barrier layer on a substrate at a high rate of deposition. What is also needed is a method of forming a barrier layer on a substrate to form an article having acceptable water vapor and oxygen transmission rates. What is further needed is an article having a barrier layer, the article having acceptable water vapor and oxygen transmission rates.

SUMMARY OF THE INVENTION

The present invention meets these and other needs by providing an article comprising a substrate having a barrier layer disposed on the surface of the substrate and methods of depositing such a barrier layer on the substrate, wherein the barrier layer is resistant to transmission of moisture and oxygen therethrough. The article may include additional layers, such as, but not limited to, an adhesion layer, abrasion resistant layers, radiation-absorbing layers, radiation-reflective layers, and conductive layers. Such articles Include, but are not limited to, light emitting diodes (LEDs), liquid crystal displays (LCDs), photovoltaic articles, electrochromic articles, organic integrated circuits, and organic electroluminescent devices (OELDs).

Accordingly, one aspect of the invention is to provide an article. The article comprises a substrate and at least one barrier layer disposed on at least one surface of the substrate, wherein the barrier layer comprises an inorganic material, and wherein the barrier layer is resistant to transmission of moisture and oxygen therethrough and has a water vapor transmission rate (WVTR) at 25° C. and 100% relative humidity of less than about 2 g/m$^2$-day and an oxygen transmission rate (OTR) at 25° C. and 100% oxygen concentration of less than about 2 cc/m$^2$-day.

A second aspect of the invention is to provide a barrier layer that is resistant to transmission of moisture and oxygen therethrough. The barrier layer comprises at least one of a metal oxide, a metal nitride, a metal carbide, and combinations thereof. Each of the metal nitride, the metal carbide, and the metal oxide contains at least one of silicon, aluminum, zinc, indium, tin, a transition metal, and combinations thereof. The barrier layer has a water vapor transmission rate (WVTR) at 25° C. and 100% relative humidity of less than about 2 g/m$^2$-day and an oxygen transmission rate (OTR) at 25° C. and 100% oxygen concentration of less than about 2 cc/m$^2$-day.

A third aspect of the invention is to provide an article. The article comprises a substrate and at least one barrier layer, the at least one barrier layer comprising at least one of a metal oxide, a metal nitride, a metal carbide, and combinations thereof, wherein each of the metal nitride, the metal carbide, and the metal oxide contains at least one of silicon, aluminum, zinc, indium, tin, a transition metal, and combinations thereof, and wherein the barrier layer is resistant to transmission of moisture and oxygen therethrough and has a water vapor transmission rate (WVTR) at 25° C. and 100% relative humidity of less than about 2 g/m$^2$-day and an oxygen transmission rate (OTR) at 25° C. and 100% oxygen concentration of less than about 2 cc/m$^2$-day.

A fourth aspect of the invention is to provide a method of forming a coated article. The coated article comprises a substrate and a barrier layer disposed thereon, wherein the barrier layer is resistant to transmission of moisture and oxygen therethrough and has a water vapor transmission rate (WVTR) at 25° C. and 100% relative humidity of less than about 2 g/m$^2$-day and an oxygen transmission rate (OTR) at 25° C. and 100% oxygen concentration of less than about 2 cc/m$^2$-day. The method comprises the steps of: providing a substrate; generating a thermal plasma, the thermal plasma having an electron temperature of less than about 1 eV; injecting at least one reagent into the thermal plasma; reacting the at least one reagent in the thermal plasma to form at least one deposition precursor; and depositing the at least one deposition precursor on the substrate at a rate of at least about 200 nm/min to form the barrier layer on the substrate.

A fifth aspect of the invention is to provide a method of forming a barrier layer on a substrate. The barrier layer is resistant to transmission of moisture and oxygen therethrough and has a water vapor transmission rate (WVTR) at 25° C. and 100% relative humidity of less than about 2 g/m$^2$-day and an oxygen transmission rate (OTR) at 25° C. and 100% oxygen concentration of less than about 2 cc/m$^2$-day, and comprises at least one of at least one of a metal oxide, a metal nitride, a metal carbide, and combinations thereof, wherein each of the metal nitride, the metal carbide, and the metal oxide contains at least one of silicon, aluminum, zinc, indium, tin, a transition metal, and combinations thereof. The method comprises the steps of: generating a thermal plasma, the thermal plasma having an electron temperature of less than about 1 eV; injecting a first reagent into the thermal plasma, the first reagent comprising at least one of silicon, aluminum, zinc, indium, tin, a transition metal, and combinations thereof; injecting a second reagent into the thermal plasma, the second reagent comprising at least one of oxygen, nitrogen, and ammonia; decomposing the first reagent and the second reagent in the thermal plasma to form a plurality of decomposition products; reacting the at least one reagent in the thermal plasma to form at least one deposition precursor; and depositing the at least one deposition precursor on the substrate at a rate of at least about 200 nm/min to form the barrier layer comprising at least one of a metal oxide, a metal nitride, a metal carbide, and combinations thereof on the substrate.

A sixth aspect of the invention is to provide a method of forming a coated article. The coated article comprises a substrate and a barrier layer disposed thereon. The barrier layer is resistant to transmission of moisture and oxygen therethrough and has a water vapor transmission rate (WVTR) at 25° C. and 100% relative humidity of less than about 2 g/m$^2$-day and an oxygen transmission rate (OTR) at 25° C. and 100% oxygen concentration of less than about 2 cc/m$^2$-day, and comprises at least one of a metal oxide, a metal nitride, a metal carbide, and combinations thereof, wherein each of the metal nitride, the metal carbide, and the metal oxide contains at least one of silicon, aluminum, zinc, indium, tin, a transition metal, and combinations thereof. The method comprises the steps of: providing a substrate; generating a thermal plasma, the thermal plasma having an electron temperature of less than about 1 eV; injecting a first reagent into the thermal plasma, the first reagent comprising at least one of silicon, aluminum, zinc, indium, tin, a transition metal, and combinations thereof; injecting a second reagent into the thermal plasma, the second reagent comprising at least one of oxygen, nitrogen, and ammonia; reacting the first reagent and the second reagent in the thermal plasma to form at least one deposition precursor; and depositing the at least one deposition precursor on the substrate at a rate of at least about 200 nm/min, thereby forming the barrier layer comprising at least one of a metal oxide, a metal nitride, a metal carbide, and combinations thereof on the substrate.

These and other aspects, advantages, and salient features of the present Invention will become apparent from the following detailed description, the accompanying drawings, and the appended claims.

DETAILED DESCRIPTION

Figure 1:
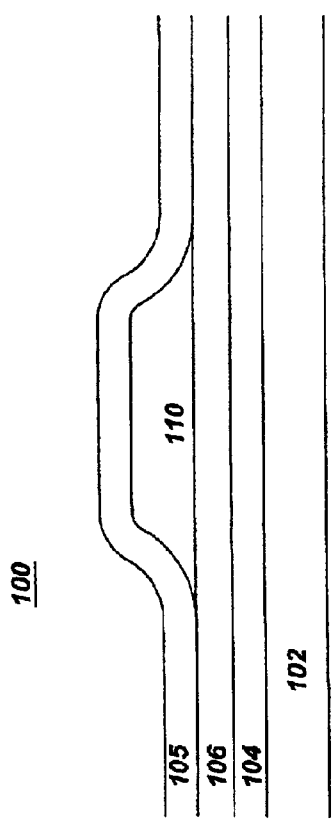
FIG. 1 is a schematic representation of an article of the present invention.

In the following description, like reference characters designate like or corresponding parts throughout the several views shown in the figures. It is also understood that terms such as "top," "bottom," "outward," "inward," and the like are words of convenience and are not to be construed as limiting terms.

Several display devices such as, but not limited to, light emitting diodes (also referred hereinafter as "LEDs"), liquid crystal displays (also referred hereinafter as "LCDs"), photovoltaic articles, flat panel display devices, electrochromic articles, and organic electroluminescent devices (also referred hereinafter as "OELDs") share a common architecture: each device includes at least one substrate and at least one "active" layer. Light emitting diodes and organic electroluminescent devices, for example, may include a cathode layer, an electron transport layer, an emission layer, a hole transport layer, and an anode layer disposed on a substrate. Liquid crystal displays may include two substrates, each having an electrically conductive layer disposed thereon, and a liquid crystal layer sandwiched between the two substrates.

Many of the materials that are used in these devices may be adversely affected by environmental factors. Electrode materials in LEDs and OELDs are sensitive to air and moisture, as are the polymeric and organic compounds that are used in OELDs and the liquid crystal materials in LCDs. Exposure to the elements—particularly oxygen and water—may severely limit the lifetime of such devices.

Selection of a substantially impermeable substrate, such as glass, provides protection from environmental attack. Polymeric substrates that are used in flexible versions of such devices, however, do not provide adequate protection against oxygen and moisture. Consequently, at least one barrier layer that is substantially impermeable to oxygen and water vapor must be applied to the polymeric substrate to achieve the desired level of protection. Here, a coating, device, or coated substrate that is described as being "substantially impermeable" is understood as having a water vapor transmission rate (also referred hereinafter as "WVTR") and an oxygen transmission rate (also referred hereinafter as "OTR") of less than about 2 g/m$^2$-day at 25° C. and 100% relative humidity and less than about 2 cc/m$^2$-day at 25° C. and 100% oxygen concentration, respectively.

Referring to the drawings in general and to FIG. 1 in particular, it will be understood that the Illustrations are for the purpose of describing a preferred embodiment of the invention and are not intended to limit the invention thereto. FIG. 1 is a schematic representation of an article 100 of the present Invention. Article 100 comprises a substrate 102 and at least one barrier layer 106 disposed on a surface of substrate 102. An additional layer 104, such as, but not limited to, an adhesion layer, may be optionally disposed between substrate 102 and the at least one barrier layer 106. Substrate 102 may comprise one of glass, a polymeric material, silicon, a metallic web, and fiberglass. Where substrate 102 is a polymeric material, substrate 102 comprises at least one of a polycarbonate, a polyethylene terephtalene, a polyethylene naphthalene, a polyimide, a polyethersulfone, a polyacrylate, a polynorbornene, and combinations thereof. In another embodiment, substrate 102 is a metallic web comprising one of aluminum and steel.

The at least one barrier layer 106 comprises an inorganic material and is resistant to the transmission of moisture and oxygen therethrough. The at least one barrier layer 106 has a WVTR of less than about 2 g/m²-day at 25° C. and 100% relative humidity and an OTR of less than about 2 cc/m²-day at 25° C. and 100% oxygen concentration. In a second embodiment, the at least one moisture layer 106 has a WVTR of less than about 1.7 g/m²-day at 25° C. and 100% relative humidity and an OTR of less than about 0.21 cc/m²-day at 25° C. and 100% oxygen concentration. In a third embodiment, the at least one barrier layer 106 has a WVTR of less than about 0.157 g/m²-day at 25° C. and 100% relative humidity and an OTR of less than about 0.13 cc/m²-day at 25° C. and 100% oxygen concentration. The at least one barrier layer 106 comprises at least one of a metal oxide, a metal nitride, a metal carbide, and combinations thereof, wherein the metal is one of silicon, aluminum, zinc, indium, tin, and a transition metal, such as, but not limited to, titanium. In one embodiment, the at least one barrier layer 106 comprises titanium oxide. In another embodiment, the at least one barrier layer 106 comprises silicon nitride. The at least one barrier layer 106 has a thickness in a range from about 10 nm to about 10,000 nm. In one embodiment, the at least one barrier layer has a thickness in a range from about 20 nm to about 500 nm.

Article 100 may further include at least one layer 110, which is disposed adjacent to the at least one barrier layer 106. Where article 100 is a LCD display, the at least one layer may include at least one transparent electrically conductive layer comprising an oxide of tin, cadmium, indium, zinc, magnesium, gallium, and combinations thereof. Where article 100 is an LED or OELD, the at least one layer may include, for example, a cathode layer, an electron transport layer, an emission layer (in OELDs), a hole transport layer, and an anode layer, wherein the electron transport and hole transport layers may be either organic or inorganic material, and wherein the emission layer comprises an organic material.

Figure 2:
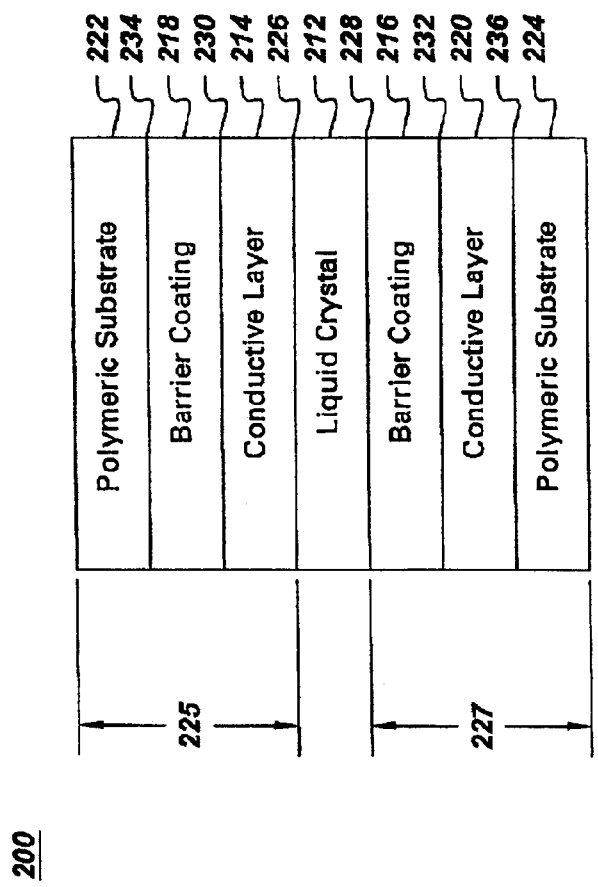
FIG. 2 is a schematic representation of a flexible liquid crystal display of the present invention.

FIG. 2 is a schematic representation of the structure of a flexible liquid crystal display of the present invention. Flexible LCD 200 comprises a center liquid crystal layer 212, a first and a second conductive layer 214, 216, a first and a second barrier layer 218, 220 and a first and a second polymeric substrate 222, 224. First polymeric substrate 222, first conductive layer 214 and first barrier layer 218 combine to form a first plate 225 and second polymeric substrate 224, second conductive layer 216 and second barrier layer 220 combine to form a second plate 227. First and second plates 225, 227 are disposed substantially parallel to one another and liquid crystal layer 212 is interposed therebetween. Flexible LCDs have been described in "A Transparent Flexible Barrier for Liquid Crystal Display Devices and Method of Making the Same," U.S. patent application Ser. No. 09/836,657, by Argemiro Soares DaSilva Sobrinho, which is incorporated herein by reference In its entirety.

Figure 3A:
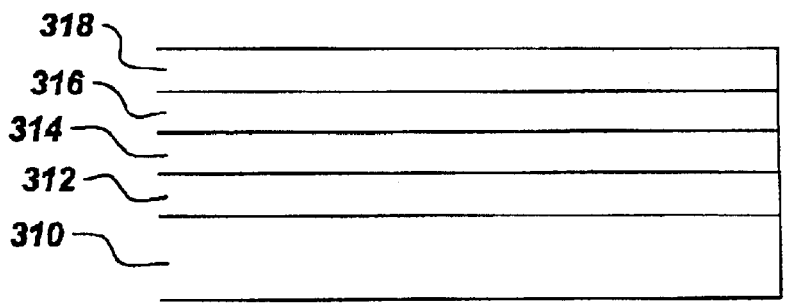
FIG. 3a is a schematic representation of a light emitting diode of the present invention.
Figure 3B:
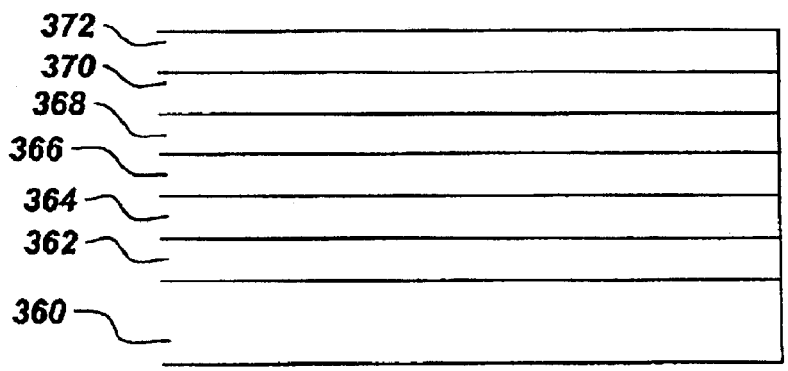
FIG. 3b is a schematic representation of a organic electroluminescent device of the present invention.

FIGS. 3a and 3b are schematic representations of a light emitting diode (LED) and an organic electroluminescent device (OELD), respectively. In LED 300 (FIG. 3a), barrier layer 312 is disposed on substrate 310. Anode 314 is disposed on barrier layer 312 opposite substrate 310. Hole transport layer 314, which comprises at least one of the n-type (negative charge accepting) semiconductors known in the art, such as, but not limited to, silicon doped with phosphorous, Is disposed on top of—and in contact with—anode 314. Electron transport layer 316, comprising at least one the p-type (positive hole) semiconductors known in the art, such as, but not limited to, silicon doped with aluminum, is disposed on top of and in contact with hole transport layer 314. Cathode 318 is disposed on top of—and in contact with—electron transport layer 316.

OELD 350 (FIG. 3b) also includes a substrate 360, barrier layer 362, anode 364, hole transport layer 366, electron transport layer 370, and cathode 372 in substantially the same relation as in LED 300, with the exception that emission layer 368 is disposed between hole transport layer 366 and electron transport layer 370. Hole transport layer 366, emission layer 368, and electron transport layer 370 each comprise an organic material in either molecular or polymeric form. Electron transport layer 370 and emission layer 368 may be combined into a single layer. Alternatively, hole transport layer 366, emission layer 368, and electron transport layer 370 may be combined into a single layer.

In other embodiments, the at least one layer 110 may comprise at least one of an adhesion layer, an abrasion-resistant layer, an ultraviolet radiation-absorbing layer, and an infrared radiation-reflecting layer. When the at least one layer 110 comprises an adhesion layer, which is intended to promote adhesion of barrier layer 106 to substrate 102, the adhesion layer comprises at least one of a metal in elemental form, a metal carbide, a metal oxycarbide, a metal oxide, a metal nitride, a metal oxynitride, and a metal carbonitride, wherein the metal is one of silicon, aluminum, titanium, zirconium, hafnium, tantalum, gallium, germanium, zinc, tin, cadmium, tungsten, molybdenum, chromium, vanadium, and platinum. Alternatively, the adhesion layer may comprise at least one of: amorphous carbon; a ceramic comprising at least one of glass, silica, alumina, zirconia, boron nitride, boron carbide, and boron carbonitride; a silicone; monomers; oligomers; a siloxane; a polymer; an epoxide; an acrylate; an fly acrylonitrile; a xylene; a styrene; and the like, as well as combinations thereof. When included in the at least one layer 110, the ultraviolet radiation-absorbing layer comprises at least one of titanium oxide, zinc oxide, cerium oxide, an ultraviolet radiation-absorbing organic material in either polymeric or molecular form, and combinations thereof. The infrared radiation-reflecting layer, when included in the at least one layer 110, comprises at least one of silver, aluminum, indium, tin, indium tin oxide, cadmium stannate, zinc, and combinations thereof.

In one embodiment, the at least one barrier layer 106 is interposed between the at least one layer 110 and substrate 102. In one embodiment, shown in FIG. 1, the at least one layer 110 may be disposed between barrier layer 106 and a second barrier layer 105. In addition, the at least one layer 110 need only be disposed between a portion of barrier layer 106 and second barrier layer 105, as seen in FIG. 1. Such a configuration provides all-around encapsulation and protection of the at least one layer 110 from exposure to water vapor and oxygen. In another embodiment, the at least one layer 110 is interposed between the at least one barrier layer 106 and substrate 102 (as represented by 104 in FIG. 1). One example of the latter embodiment is when the at least one layer 110 comprises an adhesion layer.

The present invention also includes a method of forming the article 100 having barrier layer 106 disposed on substrate 102, as described herein, and a method of forming barrier layer 106, which is described herein, on substrate 102. Barrier layer 106 is formed on substrate 102 by injecting at least one reactant gas into a plasma, which is generated by at least one plasma source. The at least one plasma source is preferably an expanding thermal plasma (also referred to hereinafter as "ETP") source that produces an expanding thermal plasma. Either a single plasma source or an array of a plurality of plasma sources may be used to generate the plasma. Systems having single and multiple plasma sources have been described in: "Protective Coating by High Rate Arc Plasma Deposition," U.S. Pat. No. 6,110,544, by Barry Lee-Mean Yang et al.; "Apparatus and Method for Large Area Chemical Vapor Deposition Using Expanding Thermal Plasma Generators," U.S. patent application Ser. No. 09/681,820, by Barry. Lee-Mean Yang et al.; "Large Area Plasma Coating Using Multiple Expanding Thermal Plasma Sources In Combination with a Common Injection Source," U.S. patent application Ser. No. 09/683,149, by Marc Schaepkens; and "Apparatus and Method for Depositing Large Area Coatings on Non-Planar Surfaces," U.S. patent application Ser. No. 09/683,148, by Marc Schaepkens, all of which are incorporated herein by reference in their entirety.

Figure 4:
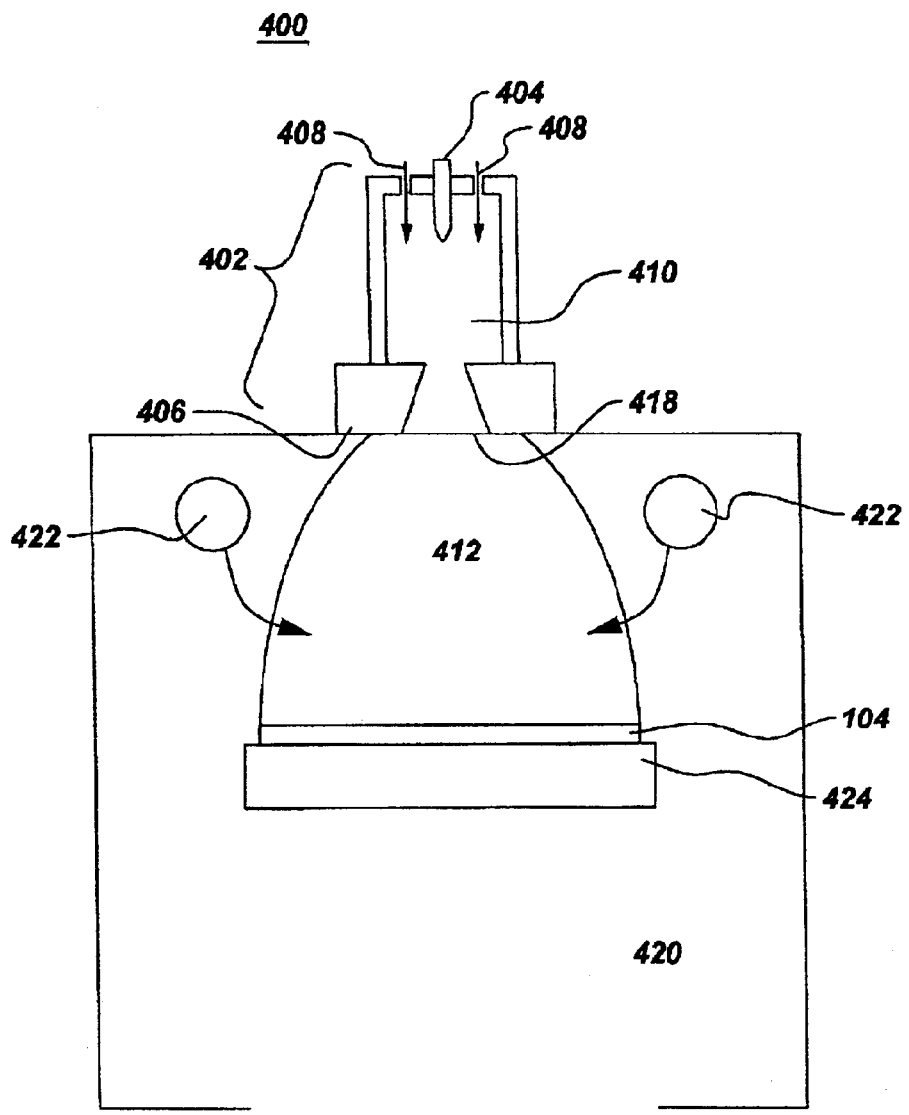
FIG. 4 is a schematic representation of an expanding thermal plasma deposition system.

A schematic representation of an ETP deposition system having a single ETP source is shown in FIG. 4. ETP deposition system 400 includes high pressure plasma chamber 410 and a low pressure deposition chamber 420, the latter containing substrate 424. ETP source 402 includes a cathode 404, an anode 406, and a plasma source gas inlet 408, of which the latter two are disposed in plasma chamber 410. The plasma source gas is an inert gas, such as a noble gas; i.e., argon, helium, neon, krypton, or xenon. Alternatively, chemically reactive gases, such as, but not limited to, nitrogen and hydrogen, may be used as the plasma source gas. Preferably, argon is used as the plasma source gas. A plasma 412, which is an expanding thermal plasma, generated in ETP source 402 by striking an arc between cathode 404 and anode 406 while introducing the plasma source gas into the arc through plasma source gas inlet 408.

Plasma chamber 410 and deposition chamber 420 are in fluid communication with each other through opening 418. Deposition chamber 420 is in fluid communication with a vacuum system (not shown), which is capable of maintaining the deposition chamber at a pressure that is lower than that of plasma chamber 410. In one embodiment, the deposition chamber 420 is maintained at a pressure of less than about 1 torr (about 133 Pa) and, preferably, at a pressure of less than about 100 millitorr (about 0.133 Pa), while plasma chamber 410 is maintained at a pressure of at least about 0.1 atmosphere (about $1.01 \times 10^4$ Pa).

At least one reactant gas injector 422 is located in deposition chamber 420 for providing at least one reactant gas at a predetermined flow rate into the plasma generated by plasma source 402. The at least one reactant gas Is provided through at least one reactant gas injector 422 to plasma 412 as the plasma 412 enters deposition chamber 420 through opening 418. The at least one reactant gas may comprise a single reactant gas or a mixture of reactant gases. The at least one reactant gas may be provided from a single reactant gas source or separate, multiple reactant gas sources to either a single reactant gas injector system or separate reactant gas injector systems.

In an ETP, a plasma is generated by Ionizing the plasma source gas in the arc generated between the cathode and anode to produce a positive ion and an electron. The following reaction, for example, occurs when an argon plasma is generated:

$$Ar \rightarrow Ar^+ + e^-. \qquad [t1]$$

The plasma is then expanded into a high volume at low pressure, thereby cooling the electrons and positive ions. In the present invention, plasma 412 is generated in plasma chamber 410 and expanded into deposition chamber 420 through opening 418. As previously described, deposition chamber 420 is maintained at a significantly lower pressure than plasma chamber 410. Consequently, the electrons in the ETP are too cold and thus have insufficient energy to cause direct dissociation of the at least one reactant gas within the ETP. Instead, the at least one reactant gas that is introduced into the plasma may undergo charge exchange and dissociative recombination reactions with the ions and electrons within the ETP to form at least one deposition precursor. In the expanded ETP, the positive ion and electron temperatures are approximately equal and in the range of about 0.1 eV (about 1000 K). In contrast to an ETP, other types of plasmas produce electrons having a sufficiently high temperature to substantially affect the chemistry of the plasma. In such plasmas, the positive ions typically have a temperature of greater than 0.1 eV, and the electrons have a temperature of at least 1 eV, or about 10,000 K.

Once injected into plasma 412, the at least one reactant gas undergoes a reaction within the ETP to form at least one deposition precursor. Such reactions may include, but are not limited to, charge exchange reactions, dissociative recombination reactions, and fragmentation reactions. The at least one deposition precursor that is formed within the ETP is then deposited on a surface of substrate 424 to form the barrier layer 106 on substrate 424.

The at least one deposition precursor is deposited on substrate 424 at a rate of at least about 200 nm/min to form the at least one barrier layer 106 on substrate 424, although higher deposition rates are within the scope of the invention. In one embodiment, for example, the at least one deposition precursor is deposited on substrate 424 at a rate of at least about 600 nm/min. In yet another embodiment, the at least one deposition precursor is deposited on substrate 424 at a rate of at least about 3,000 nm/min. In still yet another embodiment, the at least one deposition precursor is deposited on a surface of substrate 424 at a rate of at least about 10,000 nm/min.

As previously described, the at least one barrier layer 106 comprises at least one of a metal oxide, a metal nitride, a metal carbide, and combinations thereof, wherein the metal is one of silicon, aluminum, zinc, Indium, tin, and a transition metal, such as, but not limited to, titanium. In these Instances, the at least one reactant gas includes a first gaseous reagent comprising at least one of a silane, a metal vapor, a metal halide, and an organic compound of a metal, wherein the metal is one of titanium, zinc, aluminum, indium, and tin. Exemplary silanes include disilanes, aminosilanes, and chlorosilanes. Exemplary organic compounds include titanium isopropoxide, diethyl zinc, dimethyl zinc, Indium isopropoxide, indium tert-butoxide, aluminum isopropoxide, and combinations thereof. Exemplary metal halides include the chlorides of titanium, tin, and aluminum. The at least one reactant may also comprise elemental zinc, indium, tin, and aluminum in vapor form. The first gaseous reagent is injected into plasma 412 along with a second gaseous reagent comprising at least one of oxygen, nitrogen, hydrogen, water, and ammonia. In one particular embodiment, where the at least one barrier layer 106 comprises at least one of an oxide, a nitride, and a carbide of titanium, a first gaseous reagent comprising at least one of titanium chloride and titanium isopropoxide is injected into plasma 412 along with a second reagent, which, in addition to—or instead of—oxygen, nitrogen, hydrogen, water, and ammonia, may include propane, butane, acetylene, and the like, as well as combinations thereof. In another embodiment In which the at least one barrier layer 106 comprises at least one of an oxide, a nitride, and a carbide of silicon, a first gaseous reagent comprising at least one of a silane, a disilane, an aminosilane, and a chlorosilane is injected into plasma 412 along with the second reagent. For example, a silicon nitride barrier layer may be deposited by injecting silane (SiH$_4$), diluted in helium to a concentration of about 2% and ammonia into an expanding thermal argon plasma.

As previously described, article 100 may further include at least one layer 110 in addition to the at least one barrier layer 106. In such instances, the method of forming the article 100 having barrier layer 106 disposed on substrate 102, and the method of forming barrier layer 106 on substrate 102, both of which are described herein, may further include at least one step in which the at least one layer 110 is applied to either substrate 102 or barrier layer 106. It will be appreciated by those skilled in the art that the method by which the at least one layer 110 is deposited will depend upon the nature and properties (e.g., composition, desired physical properties, and the like) of the at least one coating. The at least one layer 110 may be deposited using the ETP plasma apparatus and method described herein. Alternatively, the at least one layer 110 may be deposited using methods such as, for example, sputtering, evaporation, ion beam assisted deposition (IBAD), plasma enhanced chemical vapor deposition (PEVCD), high intensity plasma chemical vapor deposition (HIPCVD) using either an inductively coupled plasma (ICP) or electron cyclotron resonance (ECR), and the like.

The following example serves to illustrate the salient features and advantages of the present invention.

EXAMPLE 1

A polycarbonate substrate having a thickness of 30 mil (about 0.76 mm) was placed in the deposition chamber of a plasma deposition system similar to that described in the present application and schematically shown in FIG. 4. The substrate was positioned at a working distance (WD) ranging from about 25 cm to about 60 cm from the expanding thermal plasma (ETP) source. The vacuum vessel was evacuated to a pressure of less than about 100 mTorr (millitorr), argon gas was flowed through into the plasma chamber and the ETP source at a rate in a range from about 2 slm (standard liters per minute) to about 3 slm, and the plasma source was ignited. The ETP operated at a current level in the range form about 40 A to about 70 A. The pressure within the plasma chamber was in the range from about 300 torr to about 800 torr, whereas the pressure within the deposition chamber was in the range from about 45 mtorr to about 100 mtorr. The pressure differential caused the argon thermal plasma to expand into the deposition chamber, where reagents, comprising silane diluted in helium to a concentration of about 2% and ammonia, were injected through a ring injector into the expanding argon thermal plasma. The reagents reacted with the ETP to form deposition precursors, which then combined to deposit a silicon nitride material barrier layer on the polycarbonate substrate at a deposition rate of at least 200 nm/min.

Figure 5:
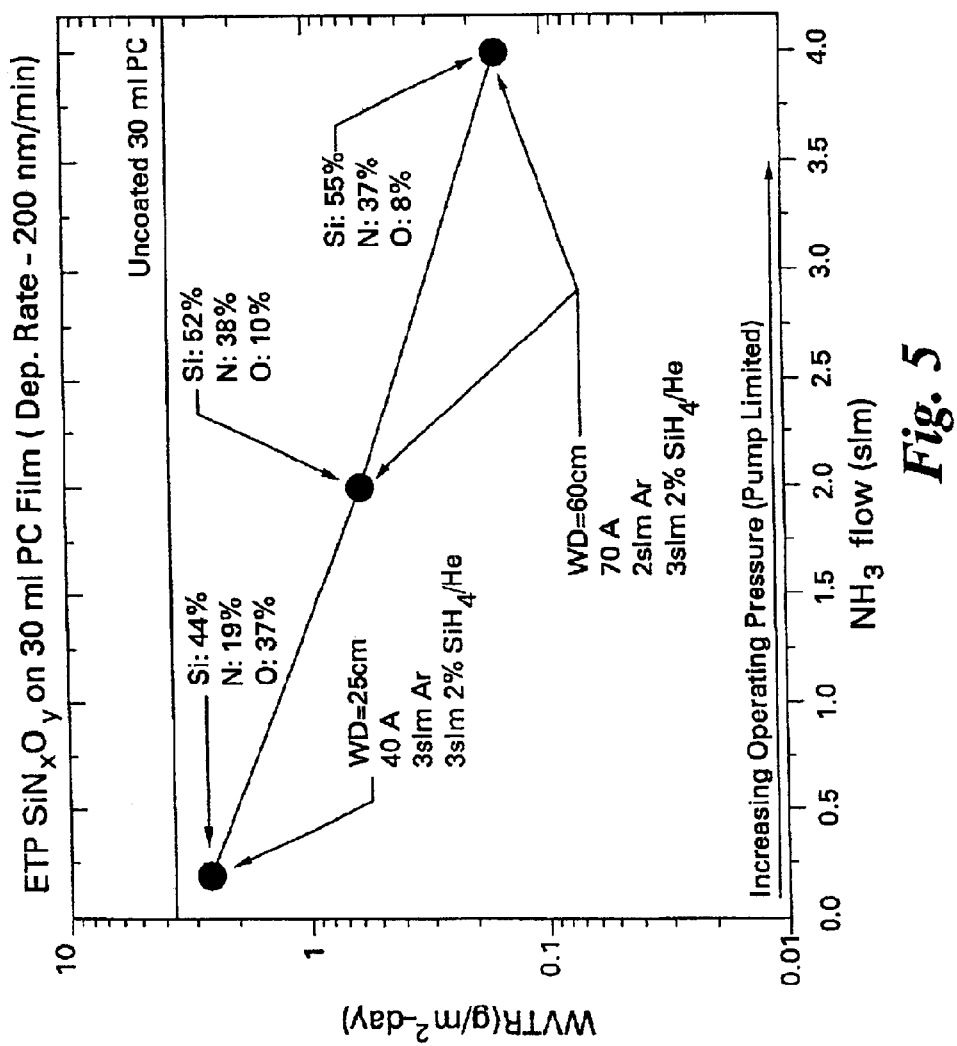
FIG. 5 is a plot of the water vapor transmission rate of a silicon nitride barrier layer of the present invention as a function of reagent flow rate.

A plot of the water vapor transmission rate (WVTR) at 25° C. and 100% relative humidity and 100% relative humidity of the silicon nitride barrier layer as a function of reagent (in this case, ammonia) flow rate is shown in FIG. 5. The WVTR for an uncoated polycarbonate film having a thickness of 30 mil is also shown in FIG. 5. As seen in FIG. 5, a single 350 nm thick silicon nitride barrier layer deposited on a polycarbonate film having a thickness of about 30 mil reduces the WVTR to less than 0.2 g/m$^2$-day. The films are highly transparent and colorless; the polycarbonate film with the silicon nitride barrier layer has a transparency of at least 89% and a yellow-index of less than 0.7.

While typical embodiments have been set forth for the purpose of illustration, the foregoing description should not be deemed to be a limitation on the scope of the invention. For example, articles, other than flexible LCD displays, LEDs and OELDs, that comprise a substrate and a barrier having the properties described herein are also considered to be within the scope of the present invention. Such articles include, but are not limited to, photovoltaic devices, electrochromic devices, x-ray imaging devices, organic integrated circuits, and rigid-substrate display devices. Accordingly, various modifications, adaptations, and alternatives may occur to one skilled in the art without departing from the spirit and scope of the present invention.

What is claimed is:

1. An article, said article comprising:
  a) a polymeric substrate comprising one of a polycarbonate, a polyimide, a polyethersulfone, a polynorbornene, a polyethylene terephthalate, a polyethylene naphthalate, a polyacrylate, and combinations thereof; and
  b) a barrier layer disposed on at least one surface of said polymeric substrate, wherein said barrier layer comprises an inorganic material, and wherein said barrier layer has a thickness of less than 10,000 nm and is resistant to transmission of moisture and oxygen therethrough and has a water vapor transmission rate (WVTR) at 25° C. and 100% relative humidity of less than about 2 g/m$^2$-day and an oxygen transmission rate (OTR) at 25° C. and 100% oxygen concentration of less than about 2cc/m$^2$-day.

2. The article according to claim 1, further including at least one layer, wherein said at least one layer is disposed on a surface of said barrier layer opposite said polymeric substrate, such that said barrier layer is interposed between said polymeric substrate and said at least one layer.

3. The article according to claim 2, wherein said at least one layer comprises at least one of an abrasion resistant layer, an ultraviolet radiation-absorbing layer, an infrared radiation-reflecting layer, and an electrically conducting layer.

4. The article according to claim 3, wherein said abrasion resistant layer comprises at least one of: a carbide of a metal, an oxycarbide of said metal, an oxide of said metal, and a nitride of said metal, wherein said metal is one of silicon, aluminum, titanium, zirconium, hafnium, tantalum, gallium, germanium, zinc, tin, cadmium, tungsten, molybdenum, chromium, vanadium, platinum, and combinations thereof.

5. The article according to claim 4, wherein said abrasion resistant layer comprises at least one of: amorphous carbon; a ceramic material, wherein said ceramic material comprises at least one of glass, silica, aluminum, zirconia, boron nitride, boron carbide, and boron carbonitride; a silicone; a siloxane; an epoxide; an acrylate; an acrylonitrile; a xylene; a styrene; polymerized monomers; polymerized oligomers; an organic polymer; an inorganic-organic polymer, and combinations thereof.

6. The article according to claim 3, wherein said ultraviolet radiation-absorbing layer comprises at least one of titanium oxide, zinc oxide, cerium oxide, a polymer, and combinations thereof.

7. The article according to claim 3, wherein said infrared radiation-reflecting layer comprises at least one of silver, aluminum, indium, tin, indium tin oxide, cadmium stannate, zinc, and combinations thereof.

8. The article according to claim 3, wherein said electrically conducting layer comprises at least one of silver, aluminum, indium, tin, indium tin oxide, cadmium stannate, zinc, and combinations thereof.

9. The article according to claim 1, further including at least one layer interposed between said barrier layer and said polymeric substrate.

10. The article according to claim 9, wherein said at least one layer comprises an abrasion resistant layer for promoting adhesion of said barrier layer to said polymeric substrate.

11. The article according to claim 10, wherein said abrasion layer comprises at least one of: a metal in elemental form, a carbide of said metal, an oxycarbide of said metal, an oxide of said metal, and a nitride of said metal, wherein said metal is one of silicon, aluminum, titanium, zirconium, hafnium, tantalum, gallium, germanium, zinc, tin, cadmium, tungsten, molybdenum, chromium, vanadium, platinum, and combinations thereof.

12. The article according to claim 11, wherein said abrasion layer comprises at least one of: amorphous carbon; a ceramic material, wherein said ceramic material comprises at least one of glass, silica, aluminum, zirconia, boron nitride, boron carbide, and boron carbonitride; a silicone; a siloxane; an epoxide; an acrylate; an acrylonitrile; a xylene; a styrene; and combinations thereof.

13. The article according to claim 1, wherein said inorganic material comprises at least one of an oxide, a nitride and a carbide of a metal, and combinations thereof.

14. The article according to claim 13, wherein said metal is one of silicon, aluminum, zinc, indium, tin, a transition metal, and combinations thereof.

15. The article according to claim 14, wherein said transition metal is titanium.

16. The article according to claim 14, wherein said at inorganic material comprises titanium oxide.

17. The article according to claim 14, wherein said inorganic material comprises silicon nitride.

18. The article according to claim 1, wherein said barrier layer has a thickness in a range from about 10 nm to less than 10,000 nm.

19. The article according to claim 18, wherein said barrier layer has a thickness in a range from about 20 nm to less than 500 nm.

20. The article according to claim 1, wherein said barrier layer has a water vapor transmission rate of up to about 0.2 g/m$^2$-day.

21. The article according to claim 1, wherein said barrier layer has an oxygen transmission rate at 25° C. and 100% oxygen concentration of up to 0.2 cc/m$^2$-day.

22. The article according to claim 1, wherein the article is one of a light emitting diode (LED), a liquid crystal display (LCD), a photovoltaic article, a flat panel display device, an electrochromic article, an organic integrated circuit, and an organic electroluminescent device (OELD).

23. The article according to claim 1, wherein said barrier layer is deposited on said polymeric substrate by: injecting at least one reagent into an expanding thermal plasma; reacting said at least one reagent in said expanding thermal plasma to form at least one deposition precursor; and depositing said at least one deposition precursor on said polymeric substrate at a rate of at least about 200 nm/min to form said barrier layer on said polymeric substrate.

24. A barrier layer deposited on a polymeric substrate, said polymeric substrate comprising one of a polycarbonate, a polyimide, a polyethersulfone, a polynorbornene, a polyethylene terephthalate, a polyethylene naphthalate, a polyacrylate, and combinations thereof, said barrier layer having a thickness of less than 10,000 nm and comprising at least one of a metal oxide, a metal nitride, a metal carbide, and combinations thereof, and wherein each of said metal nitride, said metal carbide, and said metal oxide contains at least one of silicon, aluminum, zinc, indium, tin, a transition metal, and combination thereof, and wherein said barrier layer is resistant to transmission of moisture and oxygen therethrough and has a water vapor transmission rate (WVTR) at 25° C. and 100% relative humidity of less than about 2 g/m$^2$-day and an oxygen transmission rate (OTR) at 25° C. and 100% oxygen concentration of less than about 2 cc/m$^2$-day.

25. The barrier layer according to claim 24, wherein said transition metal is titanium.

26. The barrier layer according to claim 24, wherein said barrier layer comprises titanium oxide.

27. The barrier layer according to claim 24, wherein said barrier layer comprises silicon nitride.

28. The barrier layer according to claim 24, wherein said barrier layer has a thickness in a range from about 10 nm to less than 10,000 nm.

29. The barrier layer according to claim 28, wherein said barrier layer has a thickness in a range from about 20 nm to less than 500 nm.

30. The barrier layer according to claim 24, wherein said barrier layer has a water vapor transmission rate of up to about 0.2 g/m$^2$-day.

31. The barrier layer according to claim 24, wherein said barrier layer has an oxygen transmission rate at 25° C. and 100% oxygen concentration of up to about 0.2 cc/m$^2$-day.

32. The barrier layer according to claim 24, wherein said barrier layer is deposited on said polymeric substrate by: injecting a first reagent into an expanding thermal plasma, said first reagent comprising at least one of silicon, aluminum, zinc, indium, tin, a transition metal, and combinations thereof; injecting a second reagent into said expanding thermal plasma, the second reagent comprising at least one of oxygen, nitrogen, hydrogen, water, and ammonia; reacting said first reagent and said second reagent in said expanding thermal plasma to form at least one deposition precursor; and depositing said at least one deposition precursor on said polymeric substrate at a rate of at least about 200 nm/min to form said barrier layer on said polymeric substrate.

33. The barrier layer according to claim 32, wherein the at least one deposition precursor is deposited at a rate of at least about 600 nm/min to form the barrier layer on said polymeric substrate.

34. The barrier layer according to claim 32, wherein the at least one deposition precursor is deposited on said polymeric substrate at a rate of at least about 3,000 nm/min to form the barrier layer on said polymeric substrate.

35. An article, said article comprising:
a) a polymeric substrate comprising one of a polycarbonate, a polyimide, a polyethersulfone, a polynorbornene, a polyethylene terephthalate, a polyethylene naphthalate, a polyacrylate, and combinations thereof; and
b) a barrier layer, wherein said barrier layer has a thickness of less than 10,000 nm and comprises at least one of a metal oxide, a metal nitride, a metal carbide, and combination thereof, wherein each of said metal nitride, said metal carbide, and said metal oxide contains at least one of silicon, aluminum, zinc, indium, tin, a transition metal, and combinations thereof, and wherein said barrier layer is resistant to transmission of moisture and oxygen therethrough and has a water vapor transmission rate (WVTR) at 25° C. and 100% relative humidity of less than about 2 g/m$^2$-day and an oxygen transmission rate (OTR) at 25° C. and 100% oxygen concentration of less than about 2 cc/m$^2$-day.

36. The article according to claim 35, further including at least one layer, wherein said at least one layer is deposited on a surface of said barrier layer opposite said polymeric substrate, such the said barrier layer is interposed between said polymeric substrate and said at least one layer.

37. The article according to claim 36, wherein said at least one layer comprises at least one of an abrasion resistant layer, an ultraviolet radiation-absorbing layer, infrared radiation-reflecting layer, and an electrically conducting layer.

38. The article according to claim 37, wherein said abrasion resistant layer comprises at least one of: a carbide of a metal, an oxycarbide of said metal, an oxide of said metal, and a nitride of said metal, wherein said metal is one of silicon, aluminum, titanium, zirconium, hafnium, tantalum, gallium, germanium, zinc, tin, cadmium, tungsten, molybdenum, chromium, vanadium, platinum, and combinations thereof.

39. The article according to claim 38, wherein said abrasion resistant layer comprises at least one of: amorphous carbon; a ceramic material, wherein said ceramic material comprises at least one of glass, silica, alumina, zirconia, boron nitride, boron carbide, and boron carbonitride; a silicone; a siloxane; an epoxide; an acrylate; an acrylonitrile; a xylene; a styrene; polymerized monomers; polymerized oligomers; an organic polymer; an inorganic-organic polymer; and combinations thereof.

40. The article according to claim 37, wherein said ultraviolet radiation-absorbing layer comprises at least one of titanium oxide, zinc oxide, cerium, oxide, a polymer, and combinations thereof.

41. The article according to claim 37, wherein said infrared radiation-reflecting layer comprises silver, aluminum, indium, tin, indium tin oxide, cadmium stannate, zinc, and combination thereof.

42. The article according to claim 37, wherein said electrically conducting layer comprises silver, aluminum, indium, tin, indium tin oxide, cadmium stannate, zinc, and combination thereof.

43. The article according to claim 35, further including at least one layer interposed between said barrier layer and said polymeric substrate.

44. The article according to claim 43, wherein said at least one layer comprises an adhesion layer for promoting adhesion of said barrier layer to said polymeric substrate.

45. The article according to claim 44, wherein said adhesion layer comprises at least one of: a metal in elemental form, a carbide of said metal, an oxycarbide of said metal, an oxide of said metal, and a nitride of said metal, wherein said metal is one of silicon, aluminum, titanium, zirconium, hafnium, tantalum, gallium, germanium, zinc, tin, cadmium, tungsten, molybdenum, chromium, vanadium, platinum, and combinations thereof.

46. The article according to claim 45, wherein said abrasion layer comprises at least one of: amorphous carbon; a ceramic material, wherein said ceramic material comprises at least one of glass, silica, alumina, zirconia, boron nitride, boron carbide, and boron carbonitride; a silicone; an epoxide; an acrylate; an acrylonitrile; a xylene; a styrene; and combinations thereof.

47. The barrier layer according to claim 35, wherein said transition metal is titanium.

48. The article according to claim 47, wherein said barrier layer comprises titanium oxide.

49. The barrier layer according to claim 35, wherein said barrier layer comprises silicon nitride.

50. The barrier layer according to claim 35, wherein said barrier layer has a thickness in a range from about 10 nm to less than 10,000 nm.

51. The barrier layer according to claim 50, wherein said barrier layer has a thickness in a range from about 20 nm to less than 500 nm.

52. The barrier layer according to claim 35, wherein said barrier layer has a water vapor transmission rate of up to about 0.2 g/m$^2$-day.

53. The barrier layer according to claim 35, wherein said barrier layer has an oxygen transmission rate at 25° C. and 100% oxygen concentration of up to about 0.2 cc/m$^2$-day.

54. The article according to claim 35, wherein the article is one of a light emitting diode (LED), a liquid crystal display (LCD), a photovoltaic article, a flat panel display device, an electrochromic article, an organic integrated circuit, and an organic electroluminescent device (OELD).

55. The articles according to claim 35, wherein said barrier layer is deposited on said polymeric substrate by: injecting a first reagent into an expanding thermal plasma, said first reagent comprising at least one of silicon, aluminum, zinc, indium, tin, a transition metal, and combinations thereof; injecting a second reagent into said expanding thermal plasma, the second reagent comprising at least one of oxygen, nitrogen, and ammonia; reacting said first reagent and said second reagent in said expanding thermal plasma to form at least one deposition precursor; and depositing said at least one deposition precursor on said polymeric substrate at a rate of at least about 200 nm/min to form said barrier layer on said polymeric substrate.

* * * * *